United States Patent
Mu et al.

(10) Patent No.: US 8,363,491 B2
(45) Date of Patent: Jan. 29, 2013

(54) PROGRAMMING A NON-VOLATILE MEMORY

(75) Inventors: Fuchen Mu, Austin, TX (US); Yanzhuo Wang, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 177 days.

(21) Appl. No.: 13/016,522

(22) Filed: Jan. 28, 2011

(65) Prior Publication Data

US 2012/0195124 A1    Aug. 2, 2012

(51) Int. Cl.
G11C 7/00 (2006.01)
G11C 11/34 (2006.01)
G11C 16/04 (2006.01)

(52) U.S. Cl. ......... 365/189.16; 365/185.03; 365/185.16; 365/185.28

(58) Field of Classification Search ............. 365/185.03, 365/185.16, 185.28, 189.16
See application file for complete search history.

(56) References Cited

U.S. PATENT DOCUMENTS

| | | | | |
|---|---|---|---|---|
| 5,051,953 A | * | 9/1991 | Kitazawa et al. | 365/185.33 |
| 7,321,511 B2 | * | 1/2008 | Yano et al. | 365/185.13 |
| 7,746,715 B2 | | 6/2010 | Van Duuren | |
| 2009/0073773 A1 | * | 3/2009 | Ausserlechner et al. | 365/185.23 |
| 2010/0142256 A1 | | 6/2010 | Kumar et al. | |

* cited by examiner

Primary Examiner — Ly D Pham
(74) Attorney, Agent, or Firm — Mary Jo Bertani; James L. Clingan, Jr.

(57) ABSTRACT

In a system having a plurality of non-volatile memory cells, a method includes performing hot carrier injection on a first non-volatile memory cell in a first mode of programming. In the first mode, current flows from a first current electrode to a second electrode of the first non-volatile memory cell and charge is transferred from the current to a floating gate of the first non-volatile memory cell at a location nearer the first current electrode than the second current electrode. The method further includes performing hot carrier injection on the first non-volatile memory cell in a second mode of programming. In the second mode, current flows from the second current electrode to the first electrode of the first non-volatile memory cell and charge is transferred from the current to the floating gate of the first non-volatile memory cell at a location nearer the second current electrode than the first current electrode.

10 Claims, 3 Drawing Sheets

PROGRAMMING A NON-VOLATILE MEMORY

BACKGROUND

1. Field

This disclosure relates generally to non-volatile memory devices, and more specifically, to programming a non-volatile memory device.

2. Related Art

Non-volatile memory (NVM) is the general term used to describe the type of memory that retains its data even when power is turned off, and this sort of memory is typically used to store data that must not be lost when a device incorporating the memory loses power. Such devices include computers, CD-ROMs, mobile phones, digital cameras, compact flash cards, mp3 players and Micro-Controller Units (MCUs) from the automotive, aero and other industries.

Types of non-volatile memory include Read Only Memory (ROM), Electrically Programmable Read Only Memory (EPROM), Electrically Erasable and Programmable Read Only Memory (EEPROM), Flash EEPROMs, Non-Volatile Static Random Access Memory (NVSRAM), Ferroelectric Random Access Memory (FeRAM), and the like.

Memory cells store information by storing charge on an insulated piece of semiconductor material, known as the floating gate. Typically, the insulating material is a layer of Silicon Dioxide. The charge is moved onto the insulated material forming the memory cell by either Hot Carrier Injection (HCI) or Fowler-Nordheim Tunnelling (FNT). Each individual memory cell can store a single bit of information, thus they are often referred to as bitcells.

For non-volatile memory (NVM) operation, the most popular programming method is hot carriers injection (HCI) in a memory cell. HCI works by applying a high voltage on the gate and a high voltage bias across the channel of the memory cell, resulting in the "heating" and impact ionization at the high electric field region, i.e. energy injection, of the carriers within the channel, which provides some of the carriers with enough energy to surmount the silicon dioxide energy barrier, and thus are "injected" into the floating gate. When there is little or no charge on the floating gate, the threshold voltage Vt of the transistor forming the memory cell is low. As charge is moved onto the floating gate during programming, the threshold voltage Vt of the memory cell increases. Once the threshold voltage reaches a predetermined level, the memory cell is considered programmed.

The presence of the high-energy "hot" carriers causes physical damage to a tunnel oxide insulation region in the memory cell between the drain electrode and a floating gate. As the number of program and erase cycles increases, the damage to the oxide propagates from the drain electrode toward the source electrode, thus degrading the efficiency of programming, read, and erase operations. The deterioration increases over programming cycles and can eventually cause the memory cell to fail as key parameters such as threshold voltage shift. As next-generation devices are developed, the size of the available tunnel oxide region is decreasing while the number of cycles per lifetime of the device is increasing.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

With memory cell geometry for non-volatile memory (NVM) devices scaling down and the required number of programming cycles per lifetime increasing, high cycling performance and reliability can be achieved by distributing damage to an oxide region caused by hot carrier injection from a first electrode to both first and second electrodes on a memory cell. Embodiments of systems and methods disclosed herein use a switch matrix to alternate hot carrier injection (HCI) between first and second electrodes. The first and second electrodes are symmetrical and can be selected or exchanged to receive the high voltage during HCI programming. Programming signals can be sent to a switch matrix to select whether the voltage is applied to the first or second electrode of the memory cell.

Figure 1:
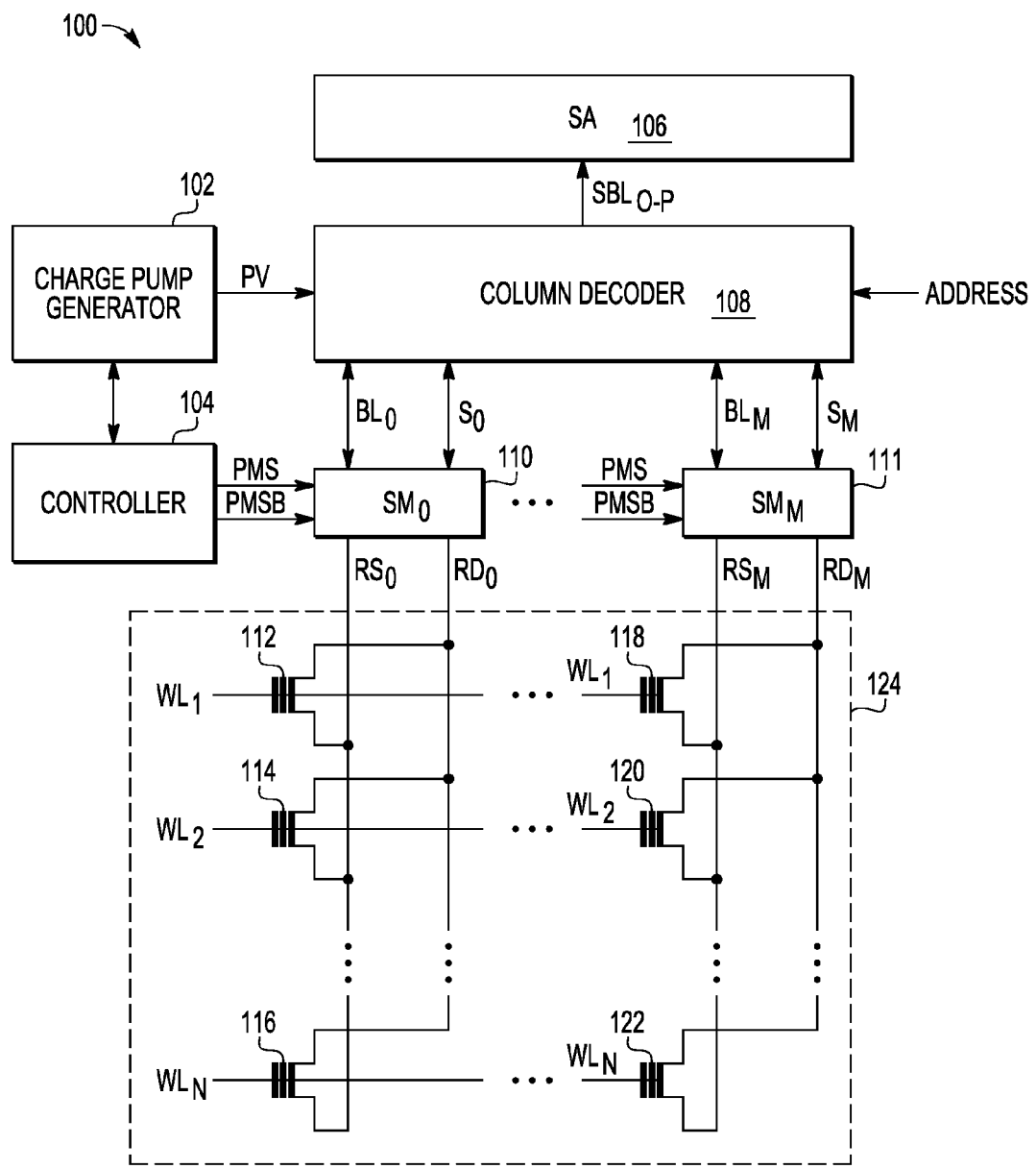
FIG. 1 is a schematic diagram of an embodiment of a non-volatile memory (NVM) system in accordance with the present disclosure.

Referring to FIG. 1, a schematic diagram of an embodiment of a non-volatile memory (NVM) system 100 is shown in accordance with the present disclosure including charge pump 102, controller 104, sense amplifier 106, column decoder 108, switch matrices 110, 111, and non-volatile memory cells 112-122 arranged in a memory cell array 124 with multiple rows and columns of memory cells 112-122. NVM system 100 can be used in any type of computer processing system (not shown) that writes and reads data, and requires the data to be stored even when the processing unit is not operating and/or power is not applied to the memory cells 112-122.

Column decoder 108 receives a specified address from a computer processing unit corresponding to the start of a particular piece of data that is to be written to or read from memory cell array 124 and translates the address to the start of particular columns of memory cells in the array 124 where the data will be written or read when a specific word line is selected with high voltage.

Switch matrices 110, 111 are typically associated with a respective column of memory cells 112-122. In the example embodiment shown, array matrix 124 includes N rows and M columns. Switch matrix 110 is coupled between column decoder 108 and Column 0 of array 124 that includes N-number of memory cells 112, 114, . . . 116. Switch matrix 111 is coupled between column decoder 108 and Column M of array 124 that includes N-number of memory cells 118, 120, . . . 122.

Column decoder 108 receives program voltage (PV) signals from charge pump 102 and provides the voltage signals to the switch matrices 110, 111 associated with the column of array 124 where data is to be written. The voltage of PV signals can be any suitable voltage, such as for example, 4.5 volts, depending on the performance characteristics of the particular memory cells 112-122 being used. The PV signals are applied to corresponding switch matrices 110, 111, as denoted by bit line signals $BL_0$ through $BL_M$ in FIG. 1. During read operations, sense amplifier 106 can transmit sense bit line (SBL) voltage signals $SBL_0$ to $SBL_p$ to column decoder 108, depending on the column to be read.

Column decoder 108 supplies source voltage signals to corresponding switch matrices 110, 111, as denoted by source signals $S_0$ through $S_M$ in FIG. 1. The voltage of the source signals $S_0$ through $S_M$ can be any suitable voltage, such as for example, ground or a floating voltage, depending on the operation being performed and the performance characteristics of the particular memory cells 112-122 being used.

Switch matrices 110, 111 receive bit line signals $BL_0$ through $BL_M$ and source signals $S_0$ through $S_M$ from column decoder 108, and program mode select (PMS) signal, and inverse program mode select (PMSB) signal from controller 104. Switch matrices 110, 111 output read drain signals $RD_0$ through $RD_M$ and read source signals $RS_0$ through $RS_M$ to corresponding columns of memory cell array 124. Read drain signals $RD_0$ through $RD_M$ are coupled to drain electrodes on corresponding memory cells 112-122 and read source signals $RS_0$ through $RS_M$ are coupled to source electrodes on corresponding memory cells 112-122.

Memory cells 112-122 also include corresponding word lines $WL_0$ through $WL_N$ that are coupled to the first of a few columns. A memory cell 112-116 to be programmed is in a selected row and coupled to a word line selected from the plurality of word lines. The programming occurs under the following conditions:
1. WL (word line) of the selected row with high voltage, e.g. 8.5V.
2. Several columns which are selected with high BL (bit line) voltage, e.g. 4.5V.

Any bit cells with either high WL voltage or high BL voltage will not be programmed. Only the bit cells with both high WL and high BL voltages will be programmed.

PMS and PMSB signals are provided to switch matrices 110, 111 by controller 104 to alternate injection of the hot carriers from the source and drain electrodes of the memory cells during programming cycles. Controller 104 also provides a programming mode signal to charge pump 102 so that charge pump 102 can supply the appropriate voltage signals for the operation to be performed. Controller 104 can be implemented as logic instructions implemented and executed in computer hardware, software, firmware, or a combination of hardware, software, and/or firmware.

Memory cells 112-122 are read by applying a bias voltage to the memory cells 112-122 and measuring the resultant current flow using current sense amplifier 106. The read voltages are set such that if the threshold voltage Vt is high, due to a memory cell 112-122 being programmed, then little or no current flows, so little or nothing is detected by sense amplifier 106. Conversely, if the threshold voltage Vt is low, due to memory cell 112-122 being unprogrammed, significantly more current flows that is detected by the sense amplifier 106. Multiple cells 112-122 may be read at one time by using multiple sense amplifiers 106.

Voltages read from the memory cells 112-122 can be used to determine whether a read, write, or erase operation was successful. If the operation was not successful, the operation may be attempted a predetermined number of times before failure of the operation and/or the memory cell 112-122 is detected.

Controller 104, column decoder 108, and/or switch matrices 110, 111 are referred to herein as all or part of a program circuit that can be implemented as logic instructions implemented and executed in computer hardware, software, firmware, or a combination of hardware, software, and/or firmware.

Figure 2:
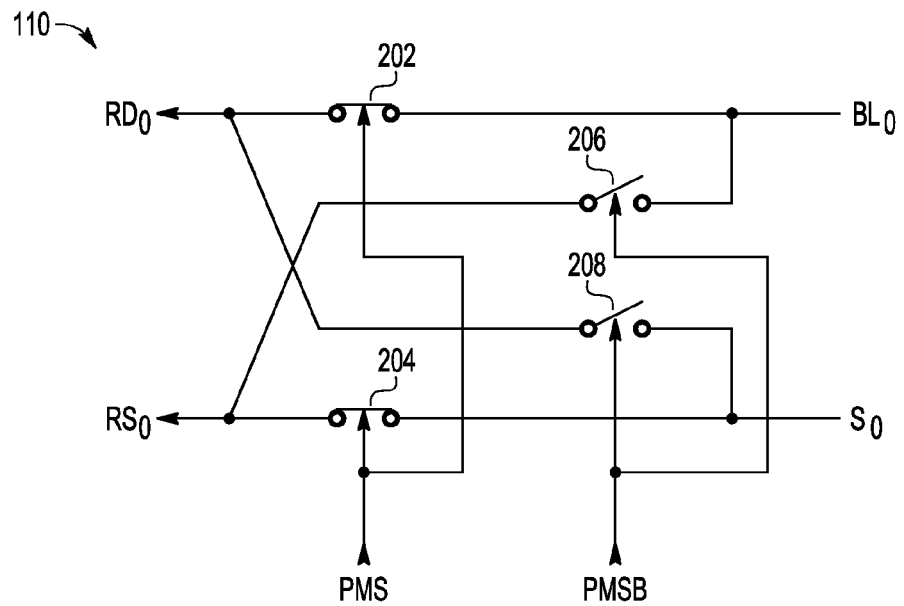
FIG. 2 is a schematic diagram of an embodiment of a switch matrix that can be used to alternate programming through source and drain electrodes of memory bit cells in a first mode of programming in the NVM system of FIG. 1.
Figure 3:
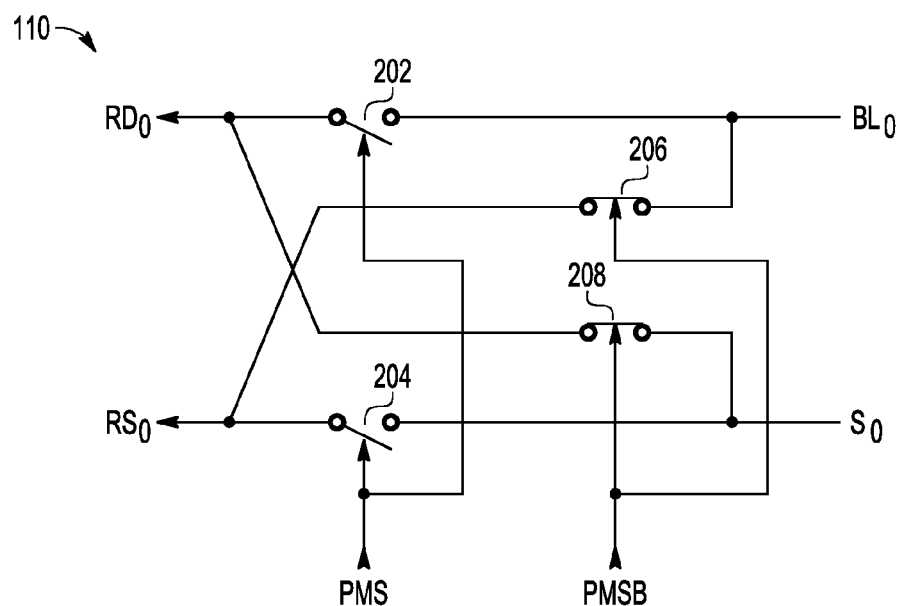
FIG. 3 is a schematic diagram of an embodiment of a switch matrix that can be used to alternate programming through source and drain electrodes of memory bit cells in a second mode of programming in the NVM system of FIG. 1.

Referring to FIGS. 2 and 3, schematic diagrams of an embodiment of a switch matrix 110 that can be used to alternate programming through first and second electrodes of bit memory cells 112-122 in the NVM system 100 of FIG. 1 are shown. A first switch 202 is coupled inline between bit line signal $BL_0$ and read drain signal $RD_0$. A second switch 204 is coupled inline between source signal $S_0$ and read source signal $RS_0$. Program mode signal PMS is coupled to control operation of switches 202, 204. For example, switches 202, 204 are closed during HCI on the drain electrode of memory cells 112-122 (FIG. 2), and open during HCI on the source electrode of memory cells 112-122 (FIG. 3).

A third switch 206 is coupled inline between bit line signal $BL_0$ and read source signal $RS_0$. A fourth switch 208 is coupled inline between source signal $S_0$ and read drain signal $RD_0$. Inverse program mode signal PMSB is coupled to control operation of switches 206, 208. For example, switches 206, 208 are closed during HCI on the source electrode of memory cells 112-122 (FIG. 3), and open during HCI on the drain electrode of memory cells 112-122 (FIG. 2).

Figure 4:
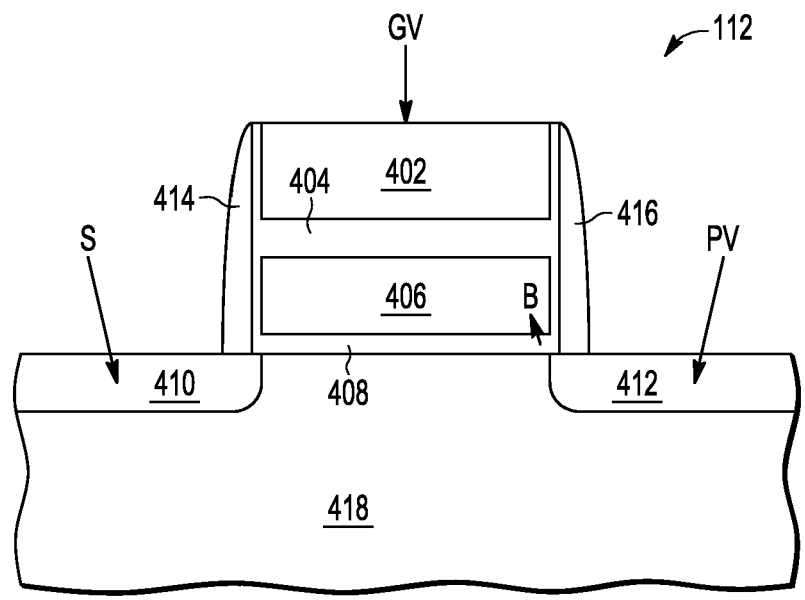
FIG. 4 is a cross-sectional diagram of an embodiment of a memory cell that can be used in the NVM system of FIG. 1 with program voltage at a first electrode.

Referring to FIG. 4, a cross-sectional diagram of an embodiment of a memory cell 112 that can be used in the NVM system 100 of FIG. 1 is shown including control gate 402, oxide/nitride/oxide (ONO) structure 404, floating gate 406, tunnel oxide 408, source electrode 410, drain electrode 412, sidewall spacers 414, 416, and substrate 418. ONO structure 404 separates control gate 402 from floating gate 406. Tunnel oxide 408 is positioned between floating gate 406 and substrate 418. Source electrode 410 is positioned on substrate 418 below sidewall spacer 414 and drain electrode 412 is positioned on substrate 418 below respective sidewall spacers 416. Control gate 402 and floating gate 406 are positioned between sidewall spacers 414, 416. Program voltage is applied at the drain electrode 412 during a first programming mode causing hot carriers to be injected into floating gate 406. The high voltage programming can physically damage tunnel oxide layer 408 near drain electrode 412 over repeated programming cycles. To distribute the damage/deterioration caused by hot carriers injection between regions of tunnel oxide 408 near source electrode 410 and near drain electrode 412, switch matrix 110 is coupled to allow programming voltage to be alternately applied to the source and drain electrodes 410, 412 during alternating programming cycles.

Figure 5:
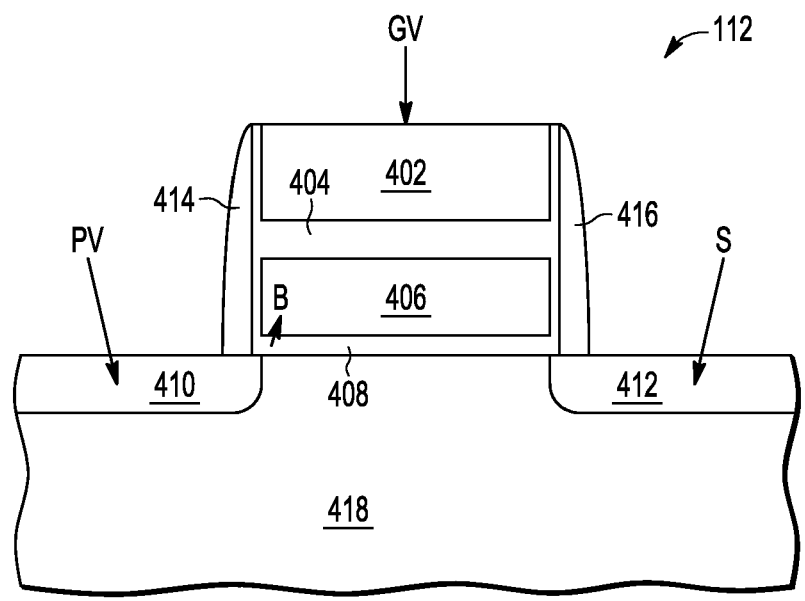
FIG. 5 is a cross-sectional diagram of the memory cell of FIG. 4 with program voltage at a second electrode.

The configuration of memory cell 112 shown in FIG. 4 corresponds to operation of switch matrix 110 shown in FIGS. 1 and 2. FIG. 5 shows a cross-sectional diagram of the memory cell 112 of FIG. 4 with program voltage applied at electrode 410 instead of electrode 412, which occurs when switch matrix 110 is operated as shown in FIG. 3.

Accordingly, in some embodiments, a memory system 100 includes non-volatile memory cells 112-122 having their own floating gate like floating gate 406. A first column of memory cells 112-116 is coupled to a first read source line $RS_0$ and a first read bit line $RD_0$. Switch matrix 110 couples first read source line $RS_0$ to a first source line $S_0$ and first read bit line $RD_0$ to a first bit line $BL_0$ in a first program mode. Alternately, switch matrix 110 couples the first read source line $RS_0$ to the first bit line $BL_0$ and the first read bit line $RD_0$ to the first source line $S_0$ in a second program mode. Decoder 108 couples a program voltage (PV) to the first a few bit lines in the first program mode and the second program mode for use in injecting charge into floating gate 406 of one or more columns of non-volatile memory cell(s) 112-122 whose word line is selected with high voltage in the first mode and in the second mode.

Decoder 108 can couple the program voltage to the first a few bit lines when the first row of non-volatile memory cells 112-118 in the first a few columns of memory array 124 is selected to be programmed with high word line voltage. Switch matrices 110, 111 provide coupling such that all programming for a programming cycle is a selected for the first mode or the second mode. The programming cycles can alternate between the first mode and the second mode. The first mode of programming is characterized by charge being distributed across floating gate 406 of a selected memory cell 112-122 after entering floating gate 406 on a first side (e.g., first electrode 412) of the floating gate 406 and away from a second side (e.g., second electrode 410) of the floating gate. The second mode of programming is characterized by charge being distributed across the floating gate after entering on the second side (e.g., second electrode 410) of the floating gate and away from the first side of the floating gate (e.g., first electrode 412).

In further embodiments, a memory 100 includes non-volatile memory cells 112-122 having their own floating gate like floating gate 406, a first current electrode 412, and a second current electrode 410. A program circuit (including controller 104, column decoder 108, and/or switch matrices 110, 111) has a first mode and a second mode. The first mode of the program circuit 102, 104, 108, 110, 111 causes a higher voltage (PV) to be applied to first current electrode 412 than second current electrode 410 of one or more selected memory cells 112-122 so that in the first mode charge is spread across floating gate 406 after entering on a first side of floating gate 406 nearest second current electrode 412. In the second mode, a higher voltage is applied to second current electrode 410 than first current electrode 412 so that in the second mode charge is spread across floating gate 406 after entering on a first side of floating gate 406 nearest second current electrode 410.

A column of non-volatile memory cells 112-116 is coupled to read source line $RS_0$ and read drain line $RD_0$. The program circuit includes a switch 110 coupled to the read source line $RS_0$ and a read drain line $RD_0$. Controller 104 and column decoder 108 are coupled to switch 110. Charge pump 102 is coupled to decoder 108. Controller 104 directs switch 110 to provide a program voltage from charge pump 102 to a selected one of read source line $RS_0$ and read drain line $RD_0$ when one or more of memory cells 112-116 from the column is selected for programming by decoder 108. The program circuit programs the selected memory cell(s) 112-116 by either the first program mode or the second program mode, or both the first mode and the second mode on an alternating basis.

In still further embodiments, a method of performing hot carrier injection on a first non-volatile memory cell 112 includes a first mode of programming in which current flows from a first electrode 412 to a second electrode 410 of the first non-volatile memory cell 112 and charge is transferred from the current to a floating gate 406 at a location nearer the first electrode 412 than the second electrode 410. In a second programming mode, hot carrier injection is performed on the non-volatile memory cell 112 in which current flows from the second electrode 410 to the first electrode 412 and charge is transferred from the current to the floating gate of the first non-volatile memory cell at a location nearer the second electrode 410 than the first electrode 412.

The method can further include verifying programming after performing hot carrier injection in the first programming mode. The verification can indicate whether the first non-volatile memory cell was successfully programmed. If the programming operation is not successful, the operation can be re-attempted. If the operation still is not successfully performed after a selected or predetermined number of attempts, the memory cell can be declared or determined to be in a failure state. Otherwise, the memory cell 112 can be considered successfully programmed.

In a memory cell array, a plurality of non-volatile memory cells 112-122 includes a number of columns and rows. The columns are coupled to read respective source lines and read bit lines. Performing hot carrier injection in the first mode comprises applying a higher voltage to the read bit line than to the read source line. Performing hot carrier injection in the second mode comprises applying a higher voltage to the read source line than to the read bit line.

In further aspects of embodiments of the method, ground potential is applied to the second current electrode 410 in the first mode. The ground potential is applied to the first current electrode 412 in the second mode. Hot carrier injection in the second mode can follow immediately from performing hot carrier injection in the first mode. Further, hot carrier injection in the second mode can be performed hot carrier injection in the first mode is unsuccessful in programming the first non-volatile memory cell 112.

By now it should be appreciated that there has been provided embodiments of systems and methods for programming non-volatile memory devices that exchange drain and source electrodes for hot carriers injection to extend the useful life of the memory device and operates reliably even as programming cycles of the device increase. The physical damage to the tunnel oxide 408 is distributed to areas of the oxide 408 near source and drain electrodes instead of just the drain electrode as found in conventional memory systems. Reducing the damage in any particular area of the oxide 408 allows more electrons to jump to the floating gate 406 during HCI and increases the programming performance.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

The movement of charge onto or off the floating gate is known as "programming" of the memory cell. However, "programming" does not in itself refer to a particular data state of the memory cell (1 or 0), because due to possible logical inversion at the output from the core memory array and/or the output to the data bus, the programmed state may correspond to either a logic 1 or 0. For this reason, the present disclosure assumes that "programmed" means that charge has been stored on the floating gate, resulting in a high threshold voltage Vt, while "unprogrammed" means that little or no charge is stored in the floating gate, thus a low Vt.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 are circuitry located on a single integrated circuit or within a same device. Alternatively, system 100 may include any number of separate integrated circuits or separate devices interconnected with each other. Also for example, system 100 or portions thereof may be soft or code representations of physical circuitry or of logical representations convertible into physical circuitry. As such, system 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" hare used to arbitrarily distinguish between the elements such terms describe. Thus, these terms are not necessarily intended to indicate temporal or other prioritization of such elements.

What is claimed is:

1. A memory comprising:
   a plurality of non-volatile memory cells, wherein each non-volatile memory cell has a floating gate, comprising a first column of the plurality of non-volatile memory cells, wherein the column is coupled to a first read source line and a first read bit line;
   a switch for coupling the first read source line to a first source line and the first read bit line to a first bit line in a first program mode and coupling the first read source line to the first bit line and the first read bit line to the first source line in a second program mode; and
   a decoder for coupling a program voltage to the first bit line in the first program mode and the second program mode for use in injecting charge into a floating gate of a non-volatile memory cell of the plurality of non-volatile memory cells in the first mode and in the second mode.

2. The memory of claim 1, wherein the decoder couples the program voltage to the first of a few bit lines when a non-volatile memory cell in the first of a few columns are selected to be programmed with high word line voltage.

3. The memory of claim 1, further comprising
   a plurality of word lines coupled to the first column, wherein a non-volatile memory cell to be programmed is in a selected column and coupled to a word line selected from the plurality of word lines.

4. The memory of claim 1, wherein the switch provides coupling such that all programming for a programming cycle is in a selected one of a group consisting of the first mode and the second mode.

5. The memory of claim 1, wherein the switch provides coupling such that programming for a programming cycle alternates between the first mode and the second mode.

6. The memory of claim 1, wherein the first mode of programming is characterized by charge being distributed across the floating gate of a selected non-volatile memory cell after entering the floating gate on a first side of the floating gate and away from a second side of the floating gate and the second mode of programming is characterized by charge being distributed across the floating gate after entering on the second side of the floating gate and away from the first side of the floating gate.

7. A memory comprising:
   a plurality of non-volatile memory cells, wherein each of the plurality of non-volatile memory cells includes a floating gate, a first current electrode, and a second current electrode; and
   a program circuit having a first mode and a second mode, wherein in the first mode the program circuit applies a higher voltage to the first current electrode than the second current electrode of a selected non-volatile memory cell so that in the first mode charge is spread across the floating gate after entering on a first side of the floating gate nearest the first current electrode and in the second mode the program circuit applies a higher voltage to the second current electrode than the first current electrode so that in the second mode charge is spread across the floating gate after entering on a first side of the floating gate nearest the second current electrode.

8. The memory of claim 7, wherein:
   the plurality of non-volatile memory cells comprise a column of non-volatile memory cells coupled to a read source line and a read drain line;

the program circuit comprises:
- a switch coupled to the read source line and a read drain line;
- a controller coupled to the switch;
- a decoder coupled to the switch; and
- a charge pump coupled to the decoder.

9. The memory of claim 8, wherein the controller directs the switch to provide a program voltage from the charge pump to a selected one of a group consisting of the read source line and the read drain line when a non-volatile memory cell from the column of non-volatile memory cells is selected for programming by the decoder.

10. The method of claim 7 wherein the program circuit programs the selected non-volatile memory cell by either exclusively a selected one of the first mode and the second mode or both the first mode and the second mode alternatively.

* * * * *